Figure 1:
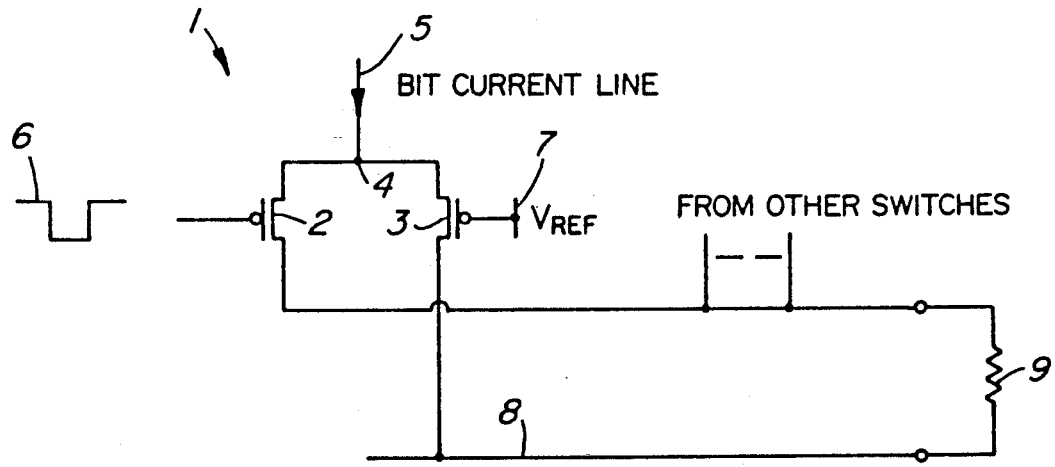

United States Patent [19]
Phillips

[11] Patent Number: 5,148,165
[45] Date of Patent: Sep. 15, 1992

[54] CMOS DIGITAL TO ANALOG SIGNAL CONVERTER CIRCUIT

[75] Inventor: Richard S. Phillips, Constance Bay, Canada

[73] Assignee: Mosaid, Inc., Kanata, Canada

[21] Appl. No.: 451,225

[22] Filed: Dec. 15, 1989

[30] Foreign Application Priority Data

Aug. 18, 1989 [CA] Canada .................... 608742

[51] Int. Cl.[5] .................. H03K 19/017; H03K 19/094
[52] U.S. Cl. ..................... 341/136; 341/133; 323/289; 330/253; 330/259; 330/264
[58] Field of Search ............... 341/133, 135, 136, 144; 323/289; 363/21; 330/250, 252, 253, 259, 263, 264, 267, 269, 277, 300

[56] References Cited

U.S. PATENT DOCUMENTS

| | | | |
|---|---|---|---|
| 3,697,852 | 10/1972 | Gerbitz | 363/21 |
| 4,484,148 | 11/1984 | Wieser et al. | 330/253 |
| 4,635,038 | 1/1987 | Wincn | 341/136 |
| 4,774,497 | 9/1988 | Taylor | 341/133 |
| 4,800,365 | 1/1989 | White et al. | 341/136 |
| 4,958,133 | 9/1990 | Bazes | 330/259 |

OTHER PUBLICATIONS

Application of Transistor Emitter-Open Turn-Off Scheme to High Voltage Power Inverters; IEEE; Jun. 29-Jul. 3, 1981; pp. 252-257.
A 300kHz Off-Line Switching Supply Using a Unique Bi-MOS Switch Combination; Power Conversion Int'l; Farrow & Taylor; Sep./Oct. 1980; pp. 20-27.

Primary Examiner—William M. Shoop, Jr.
Assistant Examiner—Helen Kim
Attorney, Agent, or Firm—Laff, Whitesel, Conte & Saret

[57] ABSTRACT

A digital to analog converter comprising a differential amplifier formed of a pair of similar conductivity type field effect transistors, one transistor being connected to a load for driving the load in synchronism with a digital input signal, means for applying a reference voltage to the gate of the second transistor, and a third field effect transistor of conductivity type complementary to said one transistor, connected with its source-drain circuit in series with the source-drain circuit of the second transistor to a second reference voltage, and means for driving the gates of said one and third transistors together with said digital input signal, whereby the first and third transistors are synchronously and oppositely driven to conduct and cut off, thus ensuring substantially no current flow in the second transistor while the first transistor is conducting.

7 Claims, 1 Drawing Sheet

CMOS DIGITAL TO ANALOG SIGNAL CONVERTER CIRCUIT

This invention relates to an improved form of digital to analog converter circuit which utilizes CMOS (complementary metal oxide silicon) transistors.

A popular digital to analog converter circuit applies each bit of a digital input word to the gate of one transistor of a pair of MOS transistors having similar conductivity type, connected as a differential amplifier. The gate of the second transistor is connected to a reference voltage. The drain of the first transistor is connected, with the drains of each of similar circuits to which the other bits of the word are applied, to a load. A current supply is applied to both source terminals of both transistors together, and the drain of the second transistor is connected to ground.

When the digital input signal logic level is lower than the reference voltage by a sufficient margin, the second transistor is rendered non-conducting, and the supply current passes through the first transistor into the load. If the digital input signal exceeds the reference level by a sufficient margin, then the supply current is diverted to ground.

In such circuit, the reference voltage must be stable, and devoid of transients. This is not easy to achieve. Also, since the current supply is usually connected in common to all of the similar circuits to which the various bits of the digital word are applied, current is drawn at different times and at different rates. Further, the potential at the common source of each differential amplifier where it is connected to the current supply varies significantly, depending on whether the input digital bit is in its high or low state. This variation makes it difficult to ensure the stability of the current level supplied to each of the circuits.

The present invention substantially solves the above problems. The reference voltage applied to the second transistor can be at ground, and is therefore highly stable. Thus a separate reference voltage line as is required in the prior art is not required in the present invention.

A large portion of the voltage change previously observed at the common source point of the differential transistors is eliminated. Thus the voltage at the current line is maintained relatively constant. This maintains the output analog voltage across the load more stable.

In addition to reducing variation in the supply current line voltage, the present invention also reduces switching noise. Since parasitic capacitance is unavoidably present at the common source node of the two transistors of the differential amplifier, that capacitance must charge and discharge with change in voltage at the common source node. With a large voltage change at the current supply line, charging and discharging of the parasitic capacitance creates transient errors in the analog level of current switched into or out of the load impedance. Since by the present invention the voltage at the bit current line is maintained relatively constant, the transient error energy is substantially reduced.

In order to achieve the above improvements, an embodiment of the present invention is a digital to analog converter comprising a differential amplifier formed of a pair of similar conductivity type field effect transistors, a first transistor being connected to a load for driving the load in synchronism with a digital input signal, apparatus for applying a reference voltage to the gate of the second transistor, and a third field effect transistor of conductivity type complementary to the first transistor, connected with its source-drain circuit in series with the source-drain circuit of the second transistor to a second reference voltage, and apparatus for driving the gates of the first and third transistors together with the digital input signal, whereby the first and third transistors are synchronously and oppositely driven to conduct and cut off, thus ensuring no current flow in the second transistor while the first transistor is conducting.

Figure 2:
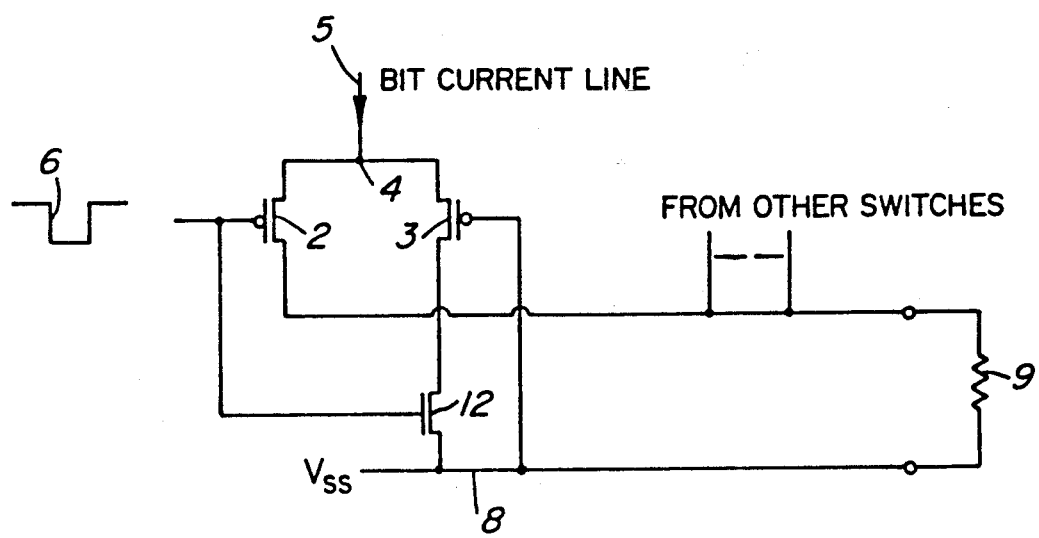

A better understanding of the invention will be obtained by reference to the detailed description below, with reference to the following drawings, in which:

FIG. 1 is a schematic diagram of a circuit in accordance with the prior art, and FIG. 2 is a schematic diagram of the basic present invention.

FIG. 1 illustrates the basic prior art circuit. A differential amplifier 1 which is formed of first and second similar conductivity MOS transistors 2 and 3 has a common source node 4 connected to a bit current line 5 (current source). The bit current line is connected in common to other differential amplifiers of similar structure. One bit 6 of a multiple bit word which is to be converted from digital to analog form is applied to the gate of the first transistor 2; other bits of the same word are applied to corresponding gates of first transistors of the other similar differential amplifiers.

A reference voltage $V_{REF}$ is connected from a reference voltage line 7 to the gate of transistor 3, and the drain of transistor 3 is connected to ground 8, at voltage level $V_{SS}$. The drain of transistor 2 is connected to one terminal of a load 9, while the other terminal of load 9 is connected to ground 8. The drain of corresponding transistors 2 are connected in parallel to the first terminal of load 9, in common with the one shown.

As is well known, the current from bit current line 5 is steered between the load and ground, depending on the level of the digital signal applied to the gate of transistor 2. When the bit level is lower than $V_{REF}$ by a sufficient margin, transistor 3 is rendered non-conductive and the current from bit current line 5 passes through transistor 2 into the load impedance. If the bit level exceeds the $V_{REF}$ by a sufficient margin, then the current from the bit current line 5 is switched to ground through transistor 3.

As noted earlier, it is not an easy task to cause the $V_{REF}$ to be a stable reference, devoid of transients. Because of constant switching of current through transistors 3 and 2, or not being switched through the transistors, depending on the level of the input signal bit 6, the potential at common source node 4 varies significantly. Parasitic capacitance unavoidably present at the common source node 4 thus charges and discharges with the variation in voltage, which creates transient errors in the analog level of current switched into or out of the load. This of course is multiplied by the number of switches connected to the same load.

As an alternative structure to that described with reference to FIG. 1, sometimes the inverse of the digital input signal is applied to the gate terminal of the gate transistor 3, rather than connecting the gate to $V_{REF}$. While this achieves a steady state constancy in the level of the common source node 4, any time delay between the complementary input signals to the gates of the two transistors results in significant transient errors, such as both transistors being momentarily conductive or non-conductive.

An embodiment of the present invention is shown in FIG. 2. In this embodiment transistors 2 and 3 are connected as a differential amplifier, with a common source node 4 connected to a bit current line 5 as before. Transistor 2 is connected with other similar circuits to load 9, as in the circuit described above. However in the present invention transistor 12, which is a complementary MOS transistor, of opposite conductivity type to that of transistor 2, is connected with its source-drain circuit in series with the drain of transistor 3 to ground 8. The digital input signal is connected in common to the gate of transistor 2 and to the gate of transistor 12. In the embodiment shown, the gate of transistor 3 is connected to ground 8.

In operation, when an input signal is at low logic level, transistor 12 is cut off and therefore no current can flow in transistor 3, even with its gate terminal connected to ground as shown. In this embodiment, there is no longer a need for an intermediate reference voltage level $V_{REF}$ as required in the prior art circuit. A large part of the voltage change previously observed at the common source node 4 is eliminated. Since a relatively constant voltage at the common source node is achieved, the bit current level remains relatively constant. Since the voltage at the common source node 4 is relatively constant, the parasitic capacitance at the common source node has substantially reduced charging and discharging, substantially reducing the switching noise, since transient energy is substantially reduced. Since transient energy is substantially reduced, transient errors in the level of the analog current switched into or out of the load is substantially reduced.

Other similar circuits are connected so that each has a separate bit of a multi-bit digital input word applied to the gate of corresponding transistors 2 and 12, and the drains of corresponding transistors 2 are connected to the first terminal of the load 9, on the leads labelled "from other switches" in FIG. 2.

In another embodiment, the gate of transistor 3 is connected to some other fixed voltage source, other than ground. Advantageously this can be the same as either the low or the high level logic state level of the digital signal source (a laboratory prototype successfully utilized the low logic state level).

Transistors 2 and 3 can be of P-type conductivity and transistor 12 can be of N-type conductivity, although the conductivity types can be reversed, with appropriate power supply polarity correction.

It should be noted that the circuit above operates due to a novel use of CMOS transistors. It cannot work using complementary bipolar transistors, since if corresponding bipolar transistors were used, open circuiting the collector terminal of bipolar transistor corresponding to transistor 3 would only have the effect of diverting the emitter current to the base terminal of the device. By using CMOS transistors however the near-simultaneous turn on and off of transistors 2 and 12 ensures minimum transient energy, and this switching is achieved without the requirement of a separate reference voltage $V_{REF}$ line.

A person skilled in the art understanding this invention may now conceive of variations or other embodiments using the principles of the invention described herein. All are considered to be within the scope of the invention as defined in the claims appended hereto.

I claim:

1. A digital to analog converter comprising a differential amplifier formed of a pair of similar conductivity type field effect transistors, one transistor being connected to a load for driving the load in synchronism with a digital input signal, means for applying a reference voltage to the gate of the second transistor, and a third field effect transistor of conductivity type complementary to said one transistor, connected with its source-drain circuit in series with the source-drain circuit of the second transistor to a second reference voltage, and means for driving the gates of said one and third transistors together synchronously and with said digital input signal to cause said one and third transistors to reciprocally and synchronously conduct and cut off, thus ensuring substantially no current flow in the second transistor while the first transistor is conducting.

2. A digital to analog converter circuit comprising at least one pair of field effect transistors of one polarity type having a common source node connected to a current source, a first of the transistors having a gate connected to a digital signal source, a second of the transistors having a gate connected to a reference voltage source, the drain of the first transistor being connected to a load, the drain of the second transistor being connected to one of the source or drain of a complementary field effect transistor of opposite polarity type to the pair of field effect transistors, the other of the drain or source of the complementary transistor being connected to ground, the gate of the complementary transistor being connected to the digital signal source, the drain-source circuit of the second transistor being alternately cut off and made conductive respectively through the complementary transistor in synchronism with conduction and cutoff respectively of the first transistor upon application of the digital signal to the gates of the first and third transistors.

3. A circuit as defined in claim 2, in which the reference voltage source is ground.

4. A circuit as defined in claim 2, including means for supplying a reference voltage source to the gate of the second transistor of complementary voltage form to the digital signal source.

5. A circuit as defined in claim 2 in which the reference voltage is the same as the low logic state level of the digital signal source.

6. A circuit as defined in claim 2 in which the first and second transistors are of P-type conductivity and the third transistor is of the N-type conductivity.

7. A converter circuit comprising a plurality of circuits as defined in claim 2, each sharing the same load, the drain of each of the first transistors of each of the plurality of circuits being connected to a common load, the digital signal being comprised of a multiple bit digital word, each bit being separately applied to the gate of the first transistor of a separate one of said circuits.

* * * * *